United States Patent
Kamo

(10) Patent No.: US 11,374,134 B2
(45) Date of Patent: Jun. 28, 2022

(54) ELECTRONIC COMPONENT DEVICE

(71) Applicant: Mitsubishi Electric Corporation, Tokyo (JP)

(72) Inventor: Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 100 days.

(21) Appl. No.: 16/770,999

(22) PCT Filed: Feb. 28, 2018

(86) PCT No.: PCT/JP2018/007533
§ 371 (c)(1),
(2) Date: Jun. 9, 2020

(87) PCT Pub. No.: WO2019/167176
PCT Pub. Date: Sep. 6, 2019

(65) Prior Publication Data
US 2020/0373441 A1 Nov. 26, 2020

(51) Int. Cl.
*H01L 31/02* (2006.01)
*G01R 19/165* (2006.01)

(52) U.S. Cl.
CPC .. *H01L 31/02021* (2013.01); *G01R 19/16552* (2013.01)

(58) Field of Classification Search
None
See application file for complete search history.

(56) References Cited

U.S. PATENT DOCUMENTS

2011/0011443 A1  1/2011  Yata et al.

FOREIGN PATENT DOCUMENTS

| JP | S63305100 A | 12/1988 |
|---|---|---|
| JP | 2001-141851 A | 5/2001 |
| JP | 2002-359676 A | 12/2002 |
| JP | 2005-129987 A | 5/2005 |
| JP | 2010-171370 A | 8/2010 |
| JP | 2011-023665 A | 2/2011 |
| WO | 2018078893 A1 | 5/2018 |

OTHER PUBLICATIONS

International Search Report; Written Opinion; and Notification of Transmittal of the International Search Report and the Written Opinion of the International Searching Authority, or the Declaration issued in PCT/JP2018/007533; dated May 22, 2018.
An Office Action; "Notice of Reasons for Refusal", mailed by the Japanese Patent Office dated Jul. 20, 2021, which corresponds to Japanese Patent Application No. 2020-503169 and is related to U.S. Appl. No. 16/770,999; with English language translation.

*Primary Examiner* — Eli S Mekhlin
(74) *Attorney, Agent, or Firm* — Studebaker & Brackett PC

(57) ABSTRACT

Examples of an electronic component device includes a housing formed of a member that causes radiation to lose its energy by generating an electric charge when the housing is subjected to the radiation and an electronic component housed in the housing. The member is a semiconductor device member having a PN junction.

2 Claims, 2 Drawing Sheets

ELECTRONIC COMPONENT DEVICE

FIELD

This patent application relates to an electronic component device.

BACKGROUND

Conventionally, as described in, for example, JP S63-305100 A, it is known that a rigid solar cell array protects satellite-mounted equipment from radiation.

PRIOR ART

Patent Literature

[PTL 1] JP S63-305100 A

SUMMARY

Technical Problem

Outer space or a space within a nuclear reactor that the conventional technique deals with provide a severe radiation environment. The development of electronic component devices for use under the severe radiation environment has heretofore been under way. In electronic component devices for use under a radiation environment, for example, circuitry configured to enhance the radiation resistance may be incorporated in each electronic component as a measure for preventing the electronic component from being damaged by irradiation. However, this measure provides complexity in which the anti-radiation special structure has to be added to each electronic component.

This patent application has been made in order to solve the problem described above, and an object thereof is to provide an electronic component device that is improved to enhance the overall radiation resistance of the electronic component device as simply as possible.

Means for Solving the Problems

According to this application, an electronic component device includes a housing formed of a semiconductor device member having a PN junction, and an electronic component housed in the housing.

Advantageous Effect of the Invention

Since a semiconductor device member having a PN junction can cause the radiation to lose its energy, the electronic components provided in the interior of the housing can be protected altogether by forming the housing of the semiconductor device member having the PN junction. Devising the structure of the housing can simply enhance the overall radiation resistance of the electronic component device regardless of whether a structural measure is provided in each electronic component.

DESCRIPTION OF EMBODIMENTS

Figure 1:
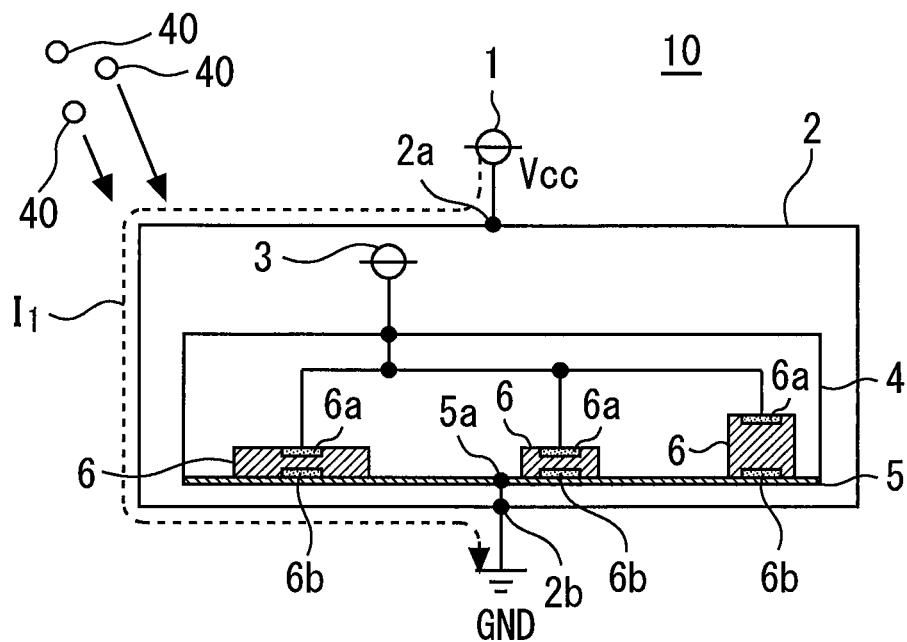
FIG. 1 is a schematic diagram illustrating an internal structure of an electronic component device according to an embodiment.

FIG. 1 is a schematic diagram illustrating an internal structure of an electronic component device 10 according to an embodiment of the present invention. The electronic component device 10 includes an outer housing 2, an inner housing 4 housed in the outer housing 2, a circuit board 5 housed in the inner housing 4, a plurality of electronic components 6 mounted on the circuit board 5, and a second power supply 3 provided inside the outer housing 2 and outside the inner housing 4. A first power supply 1 is provided outside the outer housing 2.

The outer housing 2 covers omnidirectionally the inner housing 4 from top, bottom, left, right, front, and rear thereof. The outer housing 2 may be a cube in shape as an example or may arbitrarily be a polyhedron or a sphere. A first portion 2a provided in a predetermined position on the outer housing 2 is connected to the first power supply 1. A second portion 2b provided in a predetermined position on the outer housing 2 is connected to a ground GND. In an interior of the inner housing 4, power supply terminals 6a of the electronic components 6 are connected to the second power supply 3. As a method for connecting the second power supply 3 and the power supply terminals 6a together, a connection method can be used in which the second power supply 3 and the power supply terminals 6a are connected together via power supply wires such as power supply wiring or wires provided on the circuit board 5. A circuit ground 5a of the circuit board 5 is connected to the ground GND via the second portion 2b of the outer housing 2. Ground terminals 6b of the electronic components 6 are connected to the ground GND via ground wiring on the circuit board 5. A material for the inner housing 4 may be metal such as iron, aluminum, and the like.

The electronic components 6 include functional components for various applications that are to be used under the outer space environment or the severe radiation environment. A semiconductor substrate is incorporated in an interior of the electronic component 6, and for example, a semiconductor active element such as FET, a passive element such as a capacitor, and wiring are provided on the semiconductor substrate.

When radiation 40 directly enters the electronic components 6, the radiation 40 may pass through various structures incorporated in the electronic components 6 to reach the semiconductor substrate. Examples of the various structures include a passivation film, a source field plate, a channel layer, and a buffer layer formed on the semiconductor substrate. Specifically, the radiation 40 is corpuscular radiation. The corpuscular radiation is heavy particles, protons, electrons, neutrons, muons, and the like, and these have energy of 1 keV to about 100 GeV. A number of electron-hole pairs are generated on the periphery of a locus along which the radiation 40 has passed. With no anti-radiation measure taken, the semiconductor is largely damaged and will fail or deteriorate in the process in which the electron-hole pairs generated in the electronic component 6 disperse, drift or reunite to dissipate in the device.

In this regard, the outer housing 2 is formed of a "member that generates an electric charge upon being subjected to the radiation 40 to cause the radiation 40 to lose its energy". The outer housing 2 can shield omnidirectionally the inner housing 4 from the radiation 40 from the top, bottom, left, right, front and rear thereof. The electronic components 6 can be protected from the radiation 40 by the outer housing 2. In the event that a short-circuit is caused between the first power supply 1 and the ground GND in association with generation of the electric charge when the radiation 40 is incident on the outer housing 2, a current $I_1$ as schematically shown in FIG. 1 flows.

The member constituting the outer housing 2 is the semiconductor device member having the PN junction. In this case, an outer surface of the electronic component device 10 can be entirely covered by the semiconductor device member having the PN junction. When the radiation 40 is incident on to the semiconductor device member having the PN junction, the radiation 40 loses its energy while generating an electric charge. The semiconductor device member having the PN junction may be a solar cell panel or a diode. Si may be used as a semiconductor material, and the semiconductor device member may be formed of a compound semiconductor such as GaAs. Si is advantageous in that when compared with a compound semiconductor, Si is inexpensive. Since it is general that a solar cell panel for generating electric power is provided on equipment for use in the outer space, when it is anticipated that the electronic component device 10 is used in the outer space, a solar cell panel on the outer housing 2 may be used for generating electric power. Since a solar cell panel is advantageous in that a solar cell panel of a large surface area can easily be fabricated, it is also easy that the outer housing 2 is formed into a housing having a certain expanse.

The radiation 40 loses its energy while generating an electric charge in the process in which the radiation 40 passes through the outer housing 2 fabricated using the member described above. Consequently, since the electronic components 6 can be restrained from being damaged seriously by the corpuscular radiation having high energy, the electronic components 6 provided inside the outer housing 2 can be protected.

Providing the outer housing 2 is also advantageous in that the overall resistance to the radiation 40 of the electronic component device 10 can be enhanced whether a structural measure is provided in each of the electronic components 6. To describe this advantage, for example, in the case that the electronic component 6 is a compound semiconductor device, there is a countermeasure method in which a special circuit is added to FET to enhance the radiation resistance. However, the countermeasure method of adding the special circuit may provide a risk of reducing the electric characteristics of the electronic component 6, resulting in a drawback that the reliability requires a trade-off with the electric characteristics. In this regard, according to the embodiment that has been described heretofore, since the countermeasure against the radiation 40 does not have to be incorporated in each of the electronic components 6, general-purpose electronic components 6 which take no countermeasure against irradiation can be used. Thus, the countermeasure method according to the embodiment imposes no limitation on electronic components 6 to be used in the interior of the electronic component device 10, and hence, various types of electronic components 6 can be mounted therein.

As a modified example, the inner housing 4 may be formed of a semiconductor member having a PN junction as in the aforementioned outer housing 2. In this case, the outer housing 2 may be formed of a metallic material such as iron, aluminum, and the like. In this case, too, the electronic components 6 housed in the inner housing 4 can be protected in an ensured fashion from the radiation 40. Either or both of the outer housing 2 and the inner housing 4 only have to be formed of the semiconductor device member having the PN junction.

Figure 2:
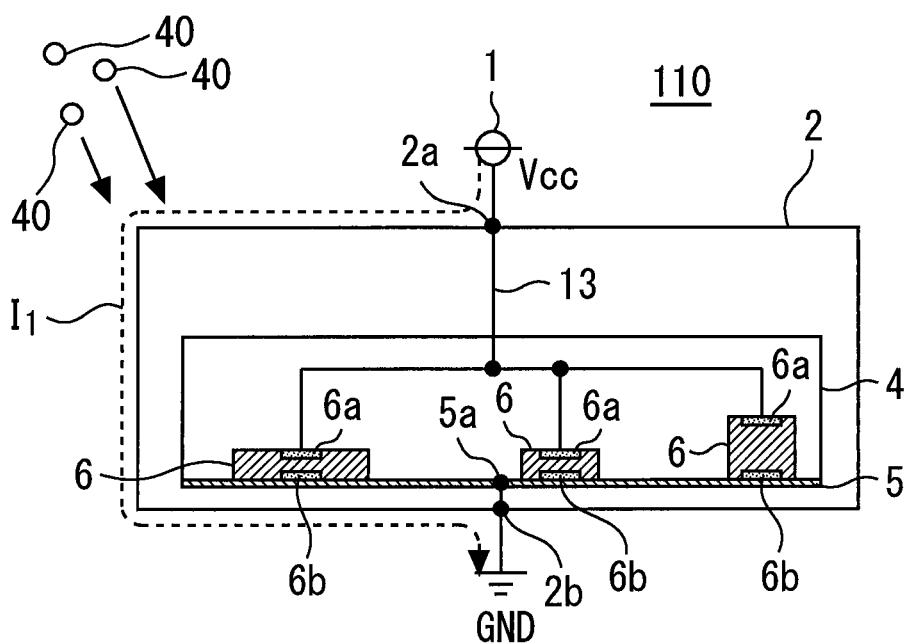
FIG. 2 is a schematic drawing illustrating an internal structure of an electronic component device according to modified example of the embodiment.

FIG. 2 is a schematic drawing illustrating an internal structure of an electronic component device 110 according to modified example of the embodiment. In the modified example in FIG. 2, the second power supply 3 in FIG. 1 is omitted, and a first power supply 1 is connected to power supply terminals 6a of electronic components 6 via a wiring 13.

The power supply terminals 6a of the electronic components 6 are connected to the first power supply 1. A first portion 2a of an outer housing 2 is connected to the wiring 13. As a result, the first portion 2a is connected to a first electrical path that connects the first power supply 1 with the power supply terminals 6a. A second portion 2b of the outer housing 2 is connected to a circuit ground 5a of a circuit board 5. As a result, the second portion 2b is connected to a second electric path that connects a ground GND with the ground terminals 6b.

Part of radiation 40 may intrude into an interior of the outer housing 2 without its energy being attenuated by the outer housing 2. Connecting electrically the outer housing 2 and an inner housing 4 in parallel can produce a short-circuit line for causing a short-circuit in the first power supply 1 and the ground GND when irradiated with the radiation 40. This short-circuit line is designed to cause a current $I_1$ to flow to the ground GND via the first power supply 1, the first portion 2a, a surface of the outer housing 2, and the second portion 2b. Since the current $I_1$ flows as shown in FIG. 2 when a short-circuit is caused between the first power supply 1 and the ground GND as a result of irradiation with the radiation 40, a voltage applied to the electronic components 6 can be reduced or made to be zero. Suppressing a power supply to the electronic components 6 sufficiently can create a situation in which the electronic components 6 are hardly caused to fail even though they are irradiated with the radiation 40.

There may be a risk of the operation of the electronic component device 110 being interrupted highly frequently when a short-circuit is designed to be caused in response to the irradiation with all of the radiation 40. Then, a threshold for a radiation amount causing a short-circuit is preferably provided so that a short-circuit is hardly caused between the first power supply 1 and the ground GND at such a radiation amount that can be accepted from the viewpoint of protecting the electronic components 6. The outer housing 2 is preferably constructed so that a power supply from the first power supply 1 to the electronic components 6 is reduced to or below a predetermined power supply suppression level when the outer housing 2 is irradiated with the radiation 40 in such an amount that exceeds the radiation amount threshold.

Figure 3:
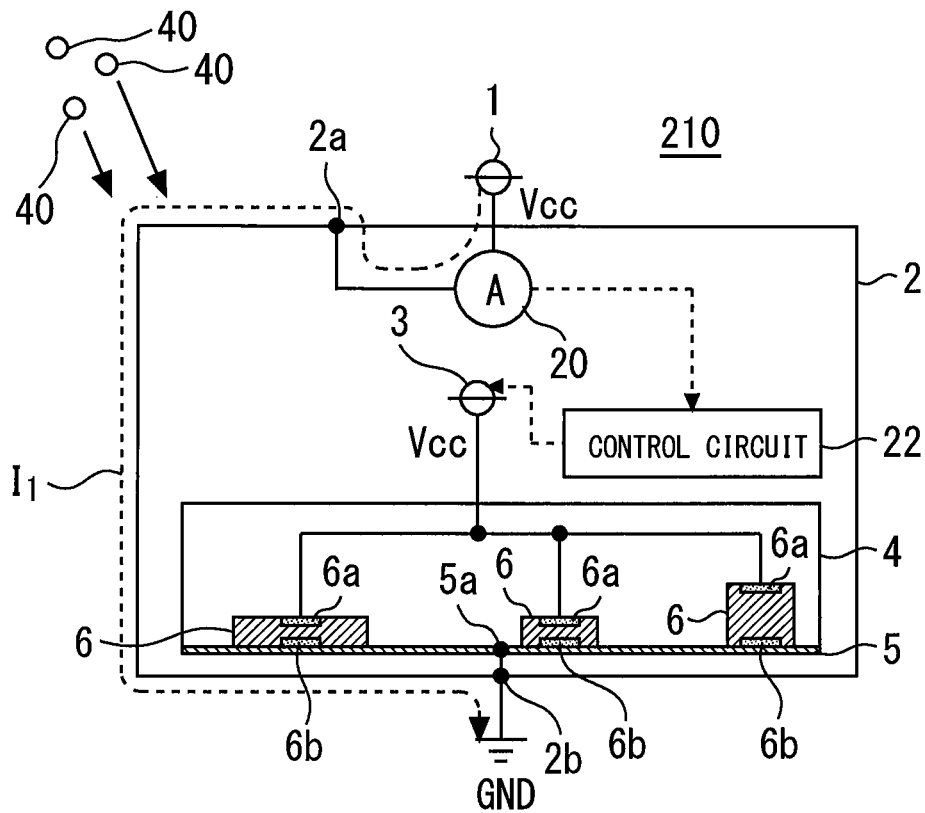
FIG. 3 is a schematic drawing illustrating an internal structure of an electronic component device according to modified example of the embodiment.

FIG. 3 is a schematic diagram illustrating an internal structure of an electronic component device 210 according a further modified example of the embodiment. An ammeter 20 and a power supply control circuit 22 are housed in an outer housing 2. The power supply control circuit 22 is connected to a second power supply 3. It is considered that a generally used integrated circuit is incorporated for detecting and controlling a power supply voltage. For example, using a known low power consuming voltage detector enables a selection of an integrated circuit matching a voltage drop amount of the outer housing 2, that is, a voltage to be detected. This integrated circuit can detect a reduction in power supply voltage and send a signal notifying a drop in voltage to other integrated circuits connected thereto. Using this constituent component can construct a control circuit configured to monitor the voltage of the power supply of the outer housing 2, send a signal notifying a drop in voltage to the power supply of the electronic component device 110 at a point in time when the drop in voltage is detected, and avoid a failure of the electronic component by reducing the voltage of the power supply.

A current $I_1$ flow as shown in FIG. 3 when a short-circuit is caused between the first power supply 1 and the ground GND as a result of irradiation with the radiation 40. The power supply control circuit 22 is configured to lower a power supply voltage that is supplied to the electronic components 6 from the second power supply 3 when a current $I_1$ having an intensity equal to or greater than a predetermined determination value flows to the outer housing 2. Specifically, the ammeter 20 can detect a current $I_1$ that flows to the outer housing 2. The power supply control circuit 22 determines whether the current $I_1$ detected by the ammeter 20 is equal to or greater than the determination value. In the case that it determines that the current $I_1$ detected is equal to or greater than the determination value, the power supply control circuit 22 reduces a supply power that is supplied to the electronic components 6 to a predetermined power level set in advance.

Part of radiation 40 may intrude into an interior of the outer housing 2 without its energy being attenuated by the outer housing 2. An irradiation situation of the outer housing 2 with the radiation 40 can be detected by detecting an electrical resistance of the outer housing 2. In the case that the outer housing 2 is irradiated with the radiation 40 to such an extent that exceeds a permissible range, the power supply control circuit 22 can lower the voltage of the second power supply 3 by detecting a change in resistance of the outer housing 2. As a result, even in the case that part of the radiation 40 that intrudes into an interior of the outer housing 2 eventually reaches the electronic components 6, the electronic components 6 can be protected in an ensured fashion by reducing a power supply voltage supplied to the electronic components 6 sufficiently. An amount by which the voltage of the second power supply 3 is reduced only needs to be determined in advance, and for example, the normal operation voltage may be designed to be reduced by something like 20%.

Figure 4:
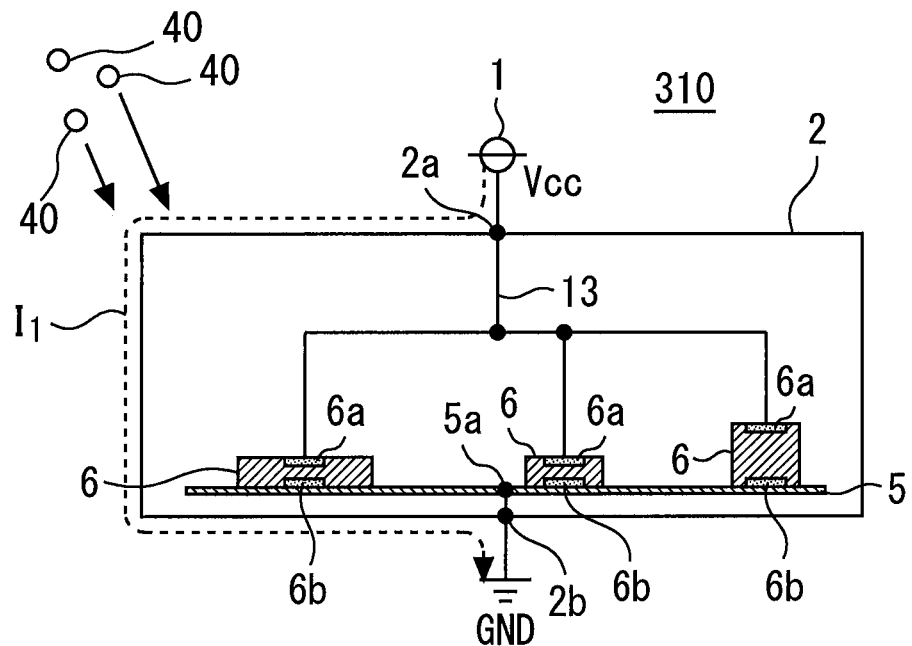
FIG. 4 is a schematic drawing illustrating an internal structure of an electronic component device according to modified example of the embodiment.

FIG. 4 is a schematic diagram illustrating an internal structure of an electronic component device 310 according to a modified example of the embodiment. In the electronic component device 10 according to the embodiment, the housing may be made up only of the outer housing 2 with the inner housing 4 omitted.

DESCRIPTION OF SYMBOLS 1 first power supply, 2 outer housing, 2a first portion, 2b second portion, 3 second power supply, 4 inner housing, 5 circuit board, 5a circuit ground, 6 electronic components, 6a power supply terminals, 6b ground terminals, 10, 110, 210, 310 electronic component device, 13 wiring, 20 ammeter, 22 power supply control circuit, 40 radiation

The invention claimed is:

1. An electronic component device comprising:
   a housing formed of a semiconductor device member having a PN junction; and
   an electronic component housed in the housing, the electronic component device being constructed such that the electronic component comprises a power supply terminal connected to a first power supply and a ground terminal connected to a ground, wherein
   a first portion of the housing is connected to a first electrical path connecting the first power supply with the power supply terminal,
   a second portion of the housing is connected to a second electrical path connecting the ground with the ground terminal, and
   a short-circuit line is generated which causes a current to flow to the ground via the first power supply, the first portion, a surface of the housing, and the second portion when the housing is subjected to radiation.

2. The electronic component device according to claim 1, further comprising:
   a power supply control circuit connected to a second power supply for the electronic component and configured to reduce a power supply voltage supplied to the electronic component from the second power supply when a current having an intensity equal to or greater than a predetermined determination value flows to the housing.

* * * * *